United States Patent
Chen et al.

(10) Patent No.: US 7,553,736 B2
(45) Date of Patent: Jun. 30, 2009

(54) INCREASING DIELECTRIC CONSTANT IN LOCAL REGIONS FOR THE FORMATION OF CAPACITORS

(75) Inventors: Hsien-Wei Chen, Sinying (TW); Hao-Yi Tsai, Hsin-Chu (TW); Hsueh-Chung Chen, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 118 days.

(21) Appl. No.: 11/486,891

(22) Filed: Jul. 13, 2006

(65) Prior Publication Data

US 2008/0014706 A1    Jan. 17, 2008

(51) Int. Cl.
*H01L 21/20* (2006.01)
(52) U.S. Cl. ............... 438/386; 257/E21.008
(58) Field of Classification Search .......... 438/387, 438/386, 243, 244
See application file for complete search history.

(56) References Cited

U.S. PATENT DOCUMENTS

| | | | |
|---|---|---|---|
| 5,305,178 A * | 4/1994 | Binder et al. ............... 361/323 |
| 6,435,943 B1 * | 8/2002 | Chang et al. ................ 451/28 |
| 6,693,043 B1 * | 2/2004 | Li et al. ...................... 438/725 |
| 6,838,300 B2 * | 1/2005 | Jin et al. ....................... 438/38 |
| 6,903,027 B2 | 6/2005 | Matsuura |
| 2005/0139881 A1 * | 6/2005 | Takaya ....................... 257/295 |
| 2007/0145544 A1 * | 6/2007 | Penka et al. ................ 257/664 |

FOREIGN PATENT DOCUMENTS

WO    WO2005/062348 A1 *    7/2005

OTHER PUBLICATIONS

Wang et al., "Effect of oxygen plasma treatment on low dielectric constant carbon-doped silicon oxide thin films", Sep. 12, 2004, Thin Solid Films, vol. 473, pp. 132-136.*

* cited by examiner

*Primary Examiner*—Alexander G Ghyka
*Assistant Examiner*—Reema Patel
(74) *Attorney, Agent, or Firm*—Slater & Matsil, L.L.P.

(57) ABSTRACT

A method for increasing capacitances of capacitors and the resulting integrated structure are provided. The method includes providing a substrate, forming a low-k dielectric layer over the substrate wherein the low-k dielectric layer includes a capacitor region and a non-capacitor region, forming a capacitor in the capacitor region, forming a masking layer which masks the non-capacitor region while leaving the capacitor region exposed, performing a local treatment to increase a k value of the low-k dielectric layer in the capacitor region, and removing the masking layer.

9 Claims, 4 Drawing Sheets

INCREASING DIELECTRIC CONSTANT IN LOCAL REGIONS FOR THE FORMATION OF CAPACITORS

TECHNICAL FIELD

This invention is related generally to integrated circuits, and more particularly to methods for increasing the capacitance of capacitors in integrated circuits.

BACKGROUND

Conductive lines or interconnect structures are used to connect devices in integrated circuits and to connect the devices to external pads. Adjacent interconnect lines form parasitic capacitors. The capacitances of such capacitors are directly proportional to the area of the capacitor plates and the dielectric constant of the dielectric material disposed between the plates and are inversely proportional to the distance between the capacitor plates (line-to-line spacing). When IC's are scaled down in size, the line-to-line spacing decreases. In addition, the number of lines needed to interconnect the increased number of devices increases. Both factors result in an increase in the line-to-line capacitances. In some high-speed circuits, this interconnect capacitance can be the limiting factor in the speed of the integrated circuit. Thus it is desirable to reduce the interconnect capacitance. Accordingly, low dielectric constant (low k) materials have been increasingly used. However, it has been found that low k materials are often subject to damage during the formation of interconnect structures.

FIGS. 1 and 2 illustrate cross-sectional views in the manufacture of a typical interconnect structure. Referring to FIG. 1, an anti-reflective coating 4 is formed on a low-k dielectric layer 2. A photo resist 6 is formed on anti-reflective coating 4. Both photo resist 6 and anti-reflective coating 4 are patterned, and an opening 8 is formed in low-k dielectric layer 2. Photo resist 6 is then removed, typically by an ashing process, which involves gases such as oxygen and/or hydrogen and nitrogen containing gases. The resulting structure is shown in FIG. 2. The ashing process adversely affects low-k dielectric layer 2. A surface layer 10 of low-k dielectric layer 2 is subject to damage due to the ashing gases. Typically, the k value of the damaged surface layer 10 increases. For example, if low-k dielectric layer 2 has a k value of 2.9 after its formation, the k value of the damaged surface layer 10 can reach from 7 to 9. This significantly increases the parasitic capacitance of the resulting interconnect structures. Various approaches have been explored to eliminate or at least reduce such an undesirable effect.

SUMMARY OF THE INVENTION

In accordance with one aspect of the present invention, a method for forming an integrated circuit includes providing a substrate, forming a low-k dielectric layer over the substrate wherein the low-k dielectric layer includes a capacitor region and a non-capacitor region, forming a capacitor in the capacitor region, forming a masking layer to mask the non-capacitor region while leaving the capacitor region exposed, performing a local treatment to increase a k value of the capacitor region of the low-k dielectric layer, and removing the masking layer.

In accordance with another aspect of the present invention, a method for forming an integrated circuit includes providing a substrate, forming a low-k dielectric layer over the substrate wherein the low-k dielectric layer includes a capacitor region and a non-capacitor region, simultaneously forming a capacitor in the capacitor region and an interconnect structure in the non-capacitor region, forming a photo resist over the non-capacitor region wherein the capacitor region is exposed through an opening in the photo resist, performing a plasma treatment to the capacitor region using a process gas selected from the group consisting essentially of oxygen, nitrogen, hydrogen, ammonia, and combinations thereof, and removing the photo resist by ashing.

In accordance with yet another aspect of the present invention, a semiconductor structure includes a substrate and a low-k dielectric layer over the substrate, wherein the low-k dielectric layer includes a capacitor region and a non-capacitor region, and wherein the capacitor region has a substantially greater k value than the non-capacitor region. The semiconductor structure further includes a metal-oxide-metal capacitor in the capacitor region and an interconnect structure in the non-capacitor region.

The advantageous features of the present invention include increased capacitances of capacitors and full compatibility with existing interconnect structure formation processes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

After their formation, low-k dielectric layers may be subject to damage during subsequent processes, and the k values may increase. The increase in the k value is an undesirable effect for the formation of interconnect structures as parasitic capacitances will be increased. However, such an increase in the k value may be used for the formation of capacitors. As is known in the art, the capacitance of a capacitor is proportional to the k value of the insulation layer between the plates of the capacitor. The preferred embodiments of the present invention illustrate a method for increasing the k value of dielectric materials in regions substantially used for forming capacitors while causing only a small k value increase due to damage in non-capacitor regions.

Figure 1:
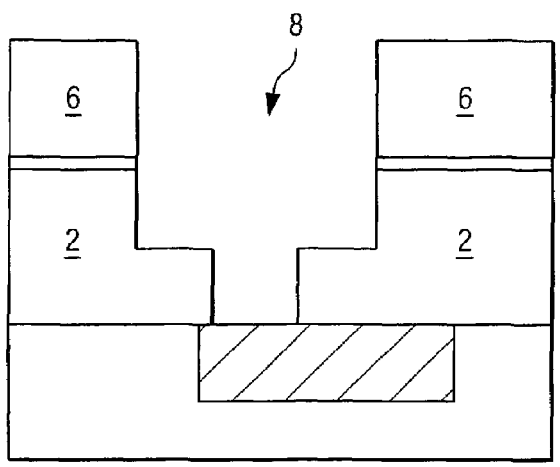
FIGS. 1 and 2 are cross-sectional views of intermediate stages in the manufacture of a conventional interconnect structure.
Figure 2:
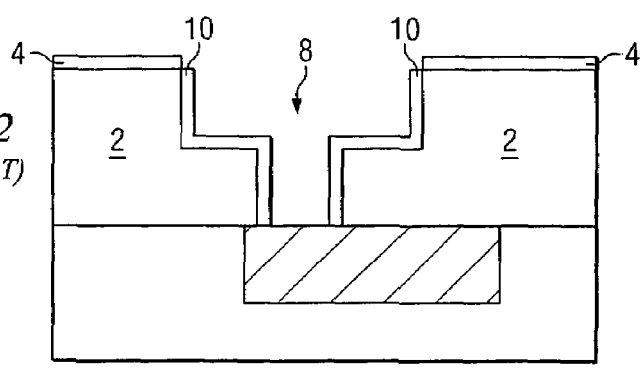
Figure 3:
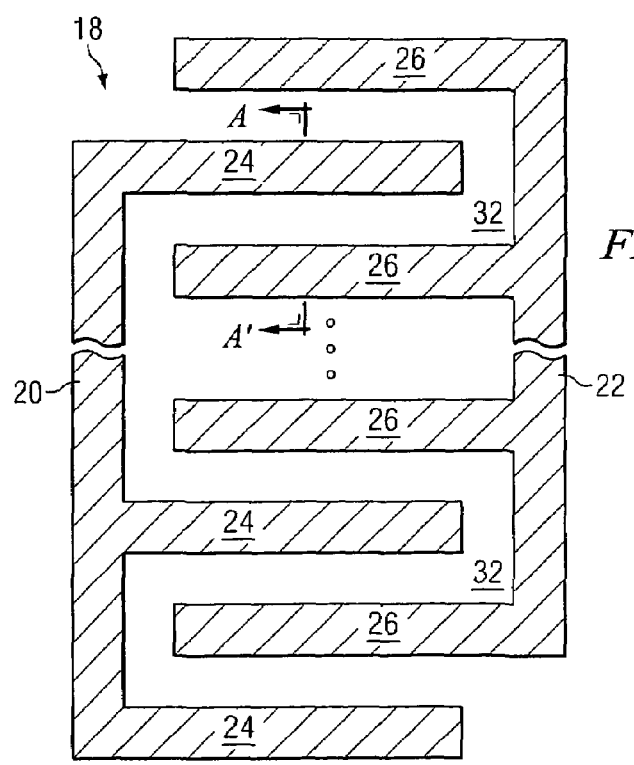
FIG. 3 illustrates a top view of a metal-oxide-metal capacitor.

FIGS. 3 through 7 illustrate a first embodiment of the present invention. FIG. 3 illustrates a top view of a metal-oxide-metal (MOM) capacitor 18, which includes a first plate and a second plate insulated by a dielectric material 32. The first plate includes a bus 20 and legs 24 connected to bus 20. The second plate includes a bus 22 and legs 26 connected to bus 22. Legs 24 and 26 are placed in an alternating pattern. Sub capacitances exist between each leg and its neighboring legs, and the total capacitance is the sum of all sub capacitances. As is known in the art, the capacitance of the MOM capacitor is substantially proportional to the k value of dielectric material 32. MOM capacitor 18 may span several metallization layers. For simplicity, only one layer is shown.

Figure 4:
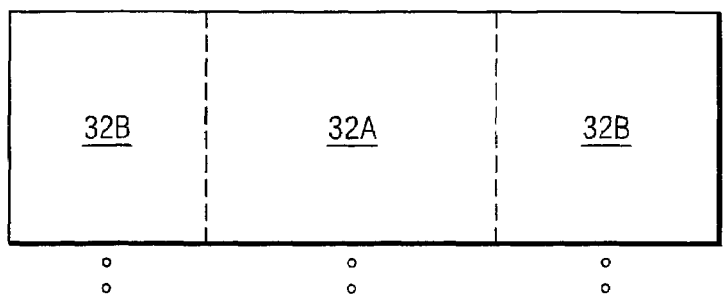
FIGS. 4 through 7 are cross-sectional views of intermediate stages in the manufacture of a first embodiment of the present invention.

FIGS. 4 through 7 illustrate cross-sectional views of intermediate stages in the manufacture of MOM capacitor 18, wherein like reference numbers are used to indicate like elements in FIG. 3. Referring to FIG. 4, a low-k dielectric layer 32 is formed over a substrate 30 in which semiconductor devices are formed. Low-k dielectric layer 32 is preferably an inter-metal dielectric (IMD) layer. In the preferred embodiment, low-k dielectric layer 32 has a low dielectric constant (k value) of less than about 3.5. The preferred formation methods include spin-on, chemical vapor deposition (CVD), plasma enhanced CVD (PECVD), atomic layer deposition (ALD), sub-atmospheric CVD (SACVD), low pressure CVD (LPCVD), and other known deposition techniques. Low-k dielectric layer 32 preferably comprises carbon-doped silicon oxides, fluorine-doped silicon oxides, and the like.

Low-k dielectric layer 32 includes a capacitor region 32A, in which a capacitor will be formed, and non-capacitor regions 32B, in which other interconnect structures such as metal lines and vias, are formed. For simplicity, only a portion of MOM capacitor 18 along a plane A-A' in FIG. 3 is illustrated in FIGS. 5 through 7.

Figure 5:
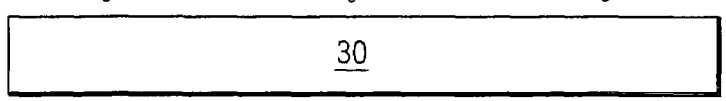
Figure 5:
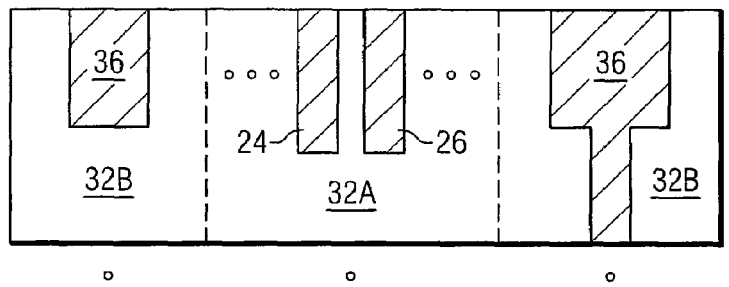

Referring to FIG. 5, MOM capacitor 18 is formed in capacitor region 32A. The cross-sectional view illustrates a leg 24 and a leg 26 (refer to FIG. 3), wherein legs 24 and 26 are electrically insulated by low-k dielectric layer 32. The remaining portion of MOM capacitor 18 is not shown. Legs 24 and 26 are each connected to a bus (refer to FIG. 3, not shown in FIG. 5). In non-capacitor region 32B, metal features 36 are schematically illustrated to symbolize interconnect structures. Metal features 24, 26 and 36 are preferably formed simultaneously using single or dual damascene processes. Each of the metal features 24, 26 and 36 are preferably formed of copper or copper alloys, although other commonly used metals such as silver, tungsten, titanium, and the like can also be used. A diffusion barrier layer (not shown) is preferably formed to prevent copper from diffusing into low-k dielectric layer 32. The formation of MOM capacitor 18 and metal features 24, 26 and 36 are well known in the art, thus are not repeated herein.

Figure 6:
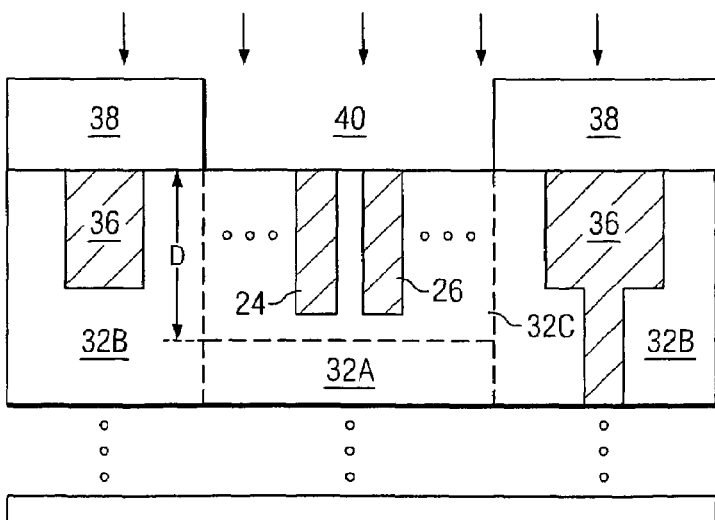
Figure 7:
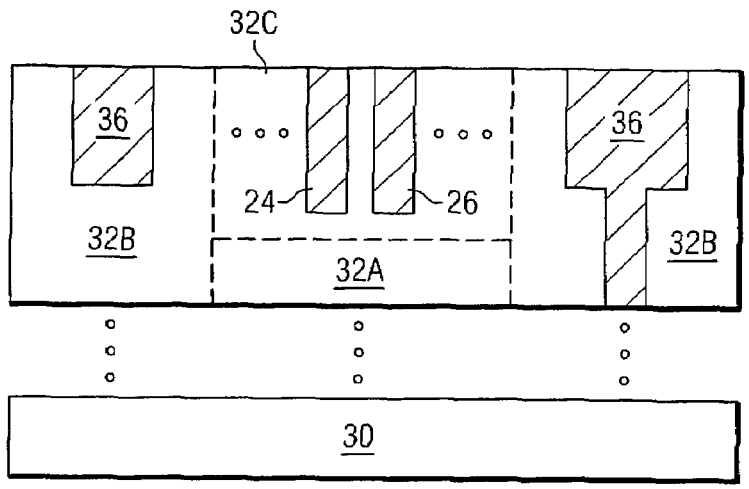

In FIG. 6, a photo resist 38 is formed on the previously formed structures. Photo resist 38 is patterned and an opening 40 is formed to expose capacitor region 32A, while non-capacitor regions 32B remain protected. Alternatively, photo resist 38 may be replaced by other masks formed of other common masking materials, such as silicon nitride, silicon carbide, and the like. A local treatment is then performed. The local treatment preferably comprises a plasma treatment. Alternatively, a thermal treatment with designated process gases may be used. The process gases preferably include oxygen, hydrogen, nitrogen, ammonia, and combinations thereof. Preferably, the process conditions of the treatment include an RF power of between about 100 W and about 2000 W, a gas flow rate of between about 1000 sccm and about 6000 sccm with a flow duration of between about 200 seconds and about 1200 seconds, and a chamber pressure of between about 20 mtorr and about 600 mtorr.

Due to the local treatment, functional groups of Si—H and/or Si—OH may be generated in low-k dielectric layer 32. Assuming low-k dielectric layer 32 contains carbon with methyl groups ($CH_3$), the exemplary reactions may be schematically indicated as:

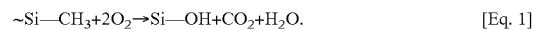  [Eq. 1]

$\sim Si\text{—}CH_3 + 2O_2 \rightarrow Si\text{—}OH + CO_2 + H_2O.$

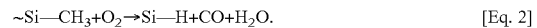  [Eq. 2]

$\sim Si\text{—}CH_3 + O_2 \rightarrow Si\text{—}H + CO + H_2O.$

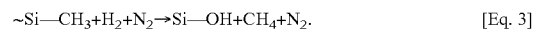  [Eq. 3]

$\sim Si\text{—}CH_3 + H_2 + N_2 \rightarrow Si\text{—}OH + CH_4 + N_2.$

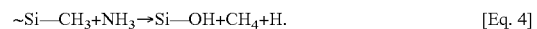  [Eq. 4]

$\sim Si\text{—}CH_3 + NH_3 \rightarrow Si\text{—}OH + CH_4 + H.$

Depending on the process gases and process conditions, one or more of the above-presented chemical reactions may occur. For example, at a RF power of about 300 W, a gas flow rate of about 100 sccm, a chamber pressure of about 30 Pa, and a substrate temperature of about 25° C., Si—H functional groups are generated, while very few Si—OH groups are generated. Conversely, at a RF power of about 900 W, a gas flow rate of about 2000 sccm, a chamber pressure of about 133 Pa, and a substrate temperature of about 200° C., Si—OH functional groups are generated, while very few Si—H groups are generated. For the process conditions between these two settings, the generated functional groups may include both Si—H and Si—OH. In the preferred embodiment, process conditions are adjusted so that more Si—OH groups are generated. Preferably, after the local treatment, the concentration of functional groups of Si—OH in the capacitor region is 30 percent greater than in the non-capacitor region.

During the local treatment, Si—$CH_3$ groups are replaced by functional groups Si—OH, which causes an increase in the k value of the treated low-k dielectric layer 32. This is a desirable feature for the formation of capacitors. In an exemplary embodiment, the k value of the treated low-k dielectric layer 32 increases from the original value of 2.9 to about 7 to 9. The respective capacitance of the capacitor is increased accordingly. The treated region (in which the k value is increased) is schematically illustrated as region 32C, wherein the depth D of the treated region 32C is related to process conditions such as the treatment time. The preferred process conditions for achieving a preferred depth D, which is substantially equal to or greater than the depth of the legs 24 and 26, can be found through routine experiments.

Due to the protection provided by photo resist 38, the treatment is local and is limited substantially to capacitor region 32A. Non-capacitor regions 32B are protected, and thus their k values are not increased. It is appreciated that due to the diffusion of treatment gases, regions 32A and 32B tend to have a gradually changed boundary, in which the composition and the k value are gradually changed.

Photo resist 38 is then removed, preferably by an ashing process. The resulting structure is shown in FIG. 7. During the local treatment, the surfaces of the legs 24 and 26 and low-k dielectric layer 32C may be damaged, and thus an optional annealing is preferably performed to restore their surfaces. Preferably, the annealing is performed in a nitrogen-containing environment with a temperature of between about 200° C. and about 400° C., and more preferably about 400° C., although higher or lower temperatures may be used.

Figure 8:
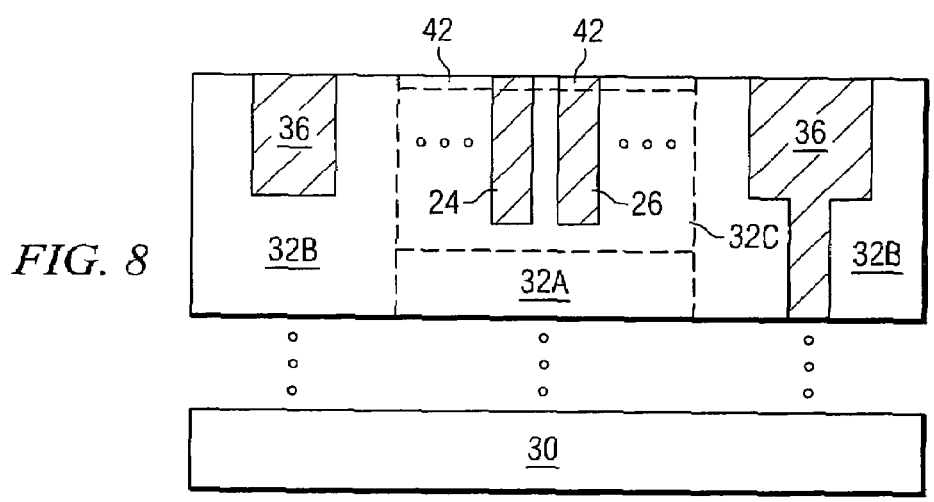
FIGS. 8 and 9 are cross-sectional views of intermediate stages in the manufacture of a second embodiment of the present invention.
Figure 9:
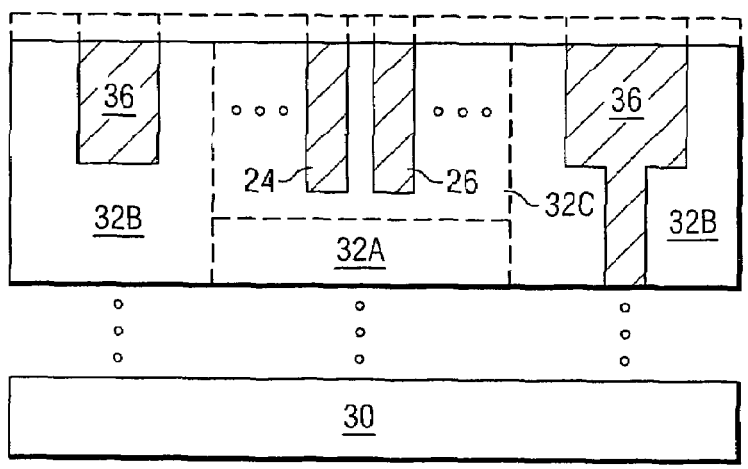

In a second embodiment of the present invention, after photo resist 38 (refer to FIG. 6) is removed, a structure as shown in FIG. 8 is formed. As is discussed in preceding paragraphs, the local treatment may damage the surfaces of legs 24 and 26 and low-k dielectric layer 32C. A thin layer 42 is schematically illustrated to represent the damaged surface layer. The damaged surface layer 42 (along with top portions of metal features 36 and low-k dielectric regions 32B) is then removed by a chemical mechanical polish (CMP) process, and the resulting structure is shown in FIG. 9, wherein the dotted lines indicate the original surfaces before the CMP is performed. Preferably, the CMP removes a layer of about 100 Å to about 400 Å.

Figure 10:
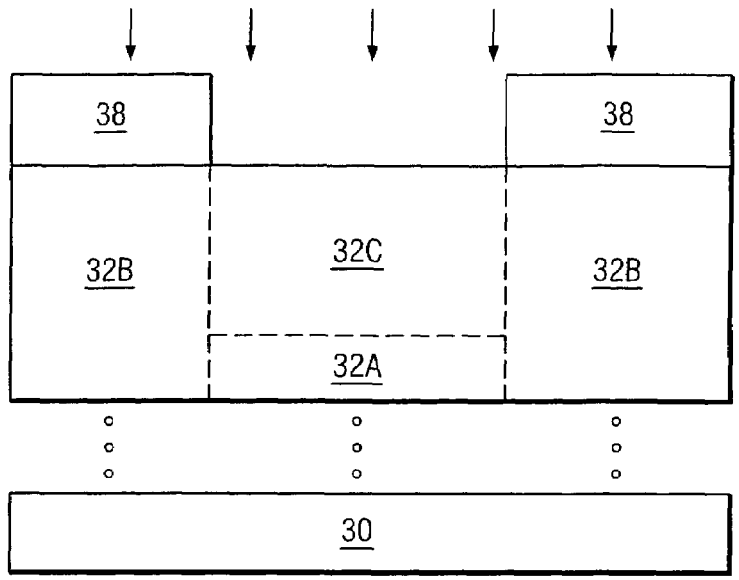
FIGS. 10 and 11 are cross-sectional views of intermediate stages in the manufacture of a third embodiment of the present invention.
Figure 11:
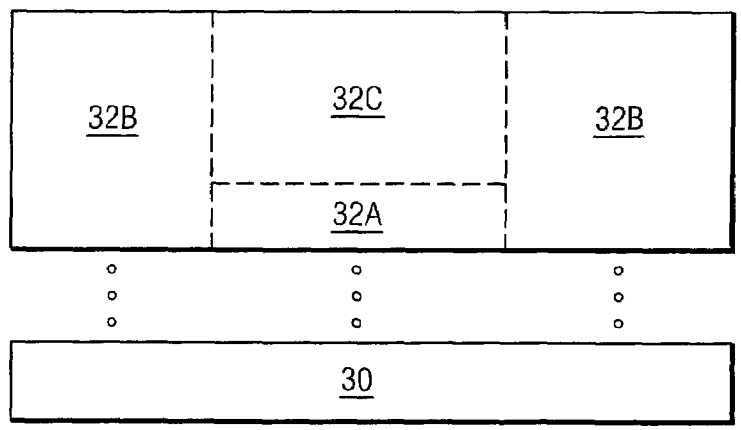

A third embodiment of the present invention is shown in FIGS. 10 and 11. The initial structure is essentially the same as in FIG. 4. In FIG. 10, photo resist 38, which protects non-capacitor regions 32B and leaves capacitor region 32A exposed, is formed and then patterned. A local treatment, which has essentially the same process conditions as in the first and the second embodiments, is performed. A treated region 32C is thus formed. Treated region 32C has an increased k value over untreated regions 32B, sometimes three times as high. In FIG. 11, photo resist 38 is removed, preferably by an ashing process.

Metal features 24, 26 and 36 are then formed, and the resulting structure is essentially the same as shown in FIG. 7. The formation processes includes single damascene and dual damascene processes. The details are not repeated herein. A nitrogen anneal is then performed using essentially the same process conditions as discussed for the first embodiment.

Figure 12:
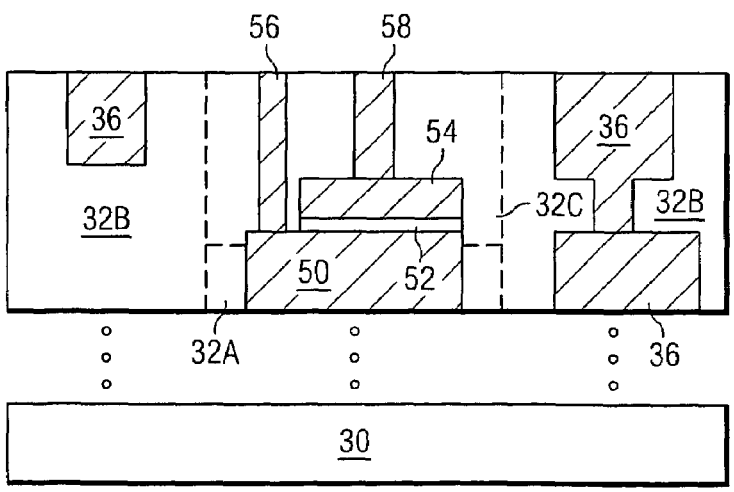
FIG. 12 is a cross-sectional view of a metal-insulator-metal (MIM) capacitor, wherein the insulation layer has an increased k value.

Although the previously discussed embodiments use MOM capacitors as examples, one skilled in the art will realize that the teaching is readily applicable to the formation of other types of capacitors. FIG. 12 illustrates a metal-insulator-metal (MIM) capacitor, which includes a bottom electrode 50, a top electrode 54 and an insulation layer 52 therebetween. Insulation layer 52 may comprise low-k dielectric layers. Contact plugs 56 and 58 connect the respective bottom electrode 50 and top electrode 54 to upper layer metal lines (not shown). Preferably, after the formation of the MIM capacitor, a local treatment is performed to increase the k value of the insulation layer 52. The resulting treated region 32C encloses insulation layer 52, and thus the k value of the insulation layer 52 is increased. As a result, the capacitance of the MIM capacitor is increased.

The preferred embodiments of the present invention are fully compatible with the existing integrated circuit formation processes. The capacitances of the capacitors can be increased by as much as three times. Such a benefit is obtained with no complicated process involved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit, the method comprising:
   providing a substrate;
   forming a low-k dielectric layer over the substrate, wherein the low-k dielectric layer includes a capacitor region and a non-capacitor region;
   forming a capacitor in the capacitor region;
   forming a masking layer to mask the non-capacitor region while leaving the capacitor region exposed;
   performing a local treatment to increase a k value of the capacitor region of the low-k dielectric layer;
   removing the masking layer; and
   after the step of forming the capacitor and the step of performing the local treatment, performing a chemical mechanical polish process to remove a top layer of the low-k dielectric layer and a top layer of the capacitor.

2. The method of claim 1, wherein the local treatment comprises a method selected from the group consisting essentially of plasma treatment, thermal treatment, and combinations thereof.

3. The method of claim 1, wherein the local treatment is performed with a process gas selected from the group consisting essentially of oxygen, nitrogen, hydrogen, ammonia, and combinations thereof.

4. The method of claim 1, wherein the local treatment increases the k value of the capacitor region by at least one hundred percent.

5. The method of claim 1, wherein the steps of forming the masking layer and performing the local treatment are performed after the step of forming the capacitor.

6. The method of claim 1, wherein the steps of forming the masking layer and performing the local treatment are performed before the step of forming the capacitor.

7. The method of claim 1 further comprising performing a nitrogen annealing after the step of performing the local treatment and the step of forming the capacitor.

8. The method of claim 1, wherein the local treatment forms Si—OH functional groups.

9. The method of claim 1, wherein the capacitor is a metal-oxide-metal capacitor comprising alternating legs, wherein neighboring legs are insulated by the low-k dielectric layer.

* * * * *